United States Patent
Li et al.

(10) Patent No.: US 11,264,979 B1
(45) Date of Patent: Mar. 1, 2022

(54) CIRCUIT AND METHOD TO ENHANCE EFFICIENCY OF SEMICONDUCTOR DEVICE

(71) Applicant: TAIWAN SEMICONDUCTOR MANUFACTURING COMPANY LTD., Hsinchu (TW)

(72) Inventors: Mao-Ruei Li, Hsinchu (TW); Ming Hsien Tsai, New Taipei (TW); Ruey-Bin Sheen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/069,643

(22) Filed: Oct. 13, 2020

(51) Int. Cl.
| | |
|---|---|
| *H03K 7/08* | (2006.01) |
| *G06F 30/20* | (2020.01) |
| *G04F 10/00* | (2006.01) |
| *H03K 3/017* | (2006.01) |
| *H03K 5/156* | (2006.01) |
| *H03L 7/085* | (2006.01) |
| *H03L 7/06* | (2006.01) |
| *G11C 16/32* | (2006.01) |

(52) U.S. Cl.
CPC .............. *H03K 7/08* (2013.01); *G04F 10/005* (2013.01); *G06F 30/20* (2020.01); *G11C 16/32* (2013.01); *H03K 3/017* (2013.01); *H03K 5/1565* (2013.01); *H03L 7/06* (2013.01); *H03L 7/085* (2013.01)

(58) Field of Classification Search
CPC ........ H03K 3/017; H03K 5/1565; H03K 7/08; H03L 7/06; H03L 7/085; G04F 10/005; G06F 30/20
USPC .......................... 332/109; 327/172, 175, 176
See application file for complete search history.

(56) References Cited

U.S. PATENT DOCUMENTS

| | | | |
|---|---|---|---|
| 10,958,257 B1* | 3/2021 | Sheen ................... | H03K 5/1565 |
| 2016/0094205 A1* | 3/2016 | Aremallapur ............ | H03K 5/06 |
| | | | 327/175 |

* cited by examiner

*Primary Examiner* — Arnold M Kinkead
(74) *Attorney, Agent, or Firm* — WPAT, P.C., Intellectual Property Attorneys; Anthony King

(57) ABSTRACT

A circuit includes a period calculator and a pulse width calculator. The period calculator is configured for receiving a first predetermined digital code and a second predetermined digital code, and for calculating a first calculated period value according to the first predetermined digital code, and calculating a second calculated period value according to the second predetermined digital code. The first predetermined digital code has a first predetermined period value, and the second predetermined digital code has a second predetermined period value. The pulse width calculator is configured for receiving a predetermined pulse width, and calculating a first pulse width code corresponding to the predetermined pulse width according to the first predetermined period value, the second predetermined period value, the first calculated period value, the second calculated period value and the predetermined pulse width.

20 Claims, 9 Drawing Sheets

CIRCUIT AND METHOD TO ENHANCE EFFICIENCY OF SEMICONDUCTOR DEVICE

BACKGROUND

The pulse width generator is a control system which is configured to output a narrow and periodical pulse signal. Conventionally, generating an accuracy pulse signal requires to measure the properties of device, which is depend on the pressure, voltage and temperature. Therefore, users should spend a lot of time setting the pulse width generator before generating the accuracy pulse signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
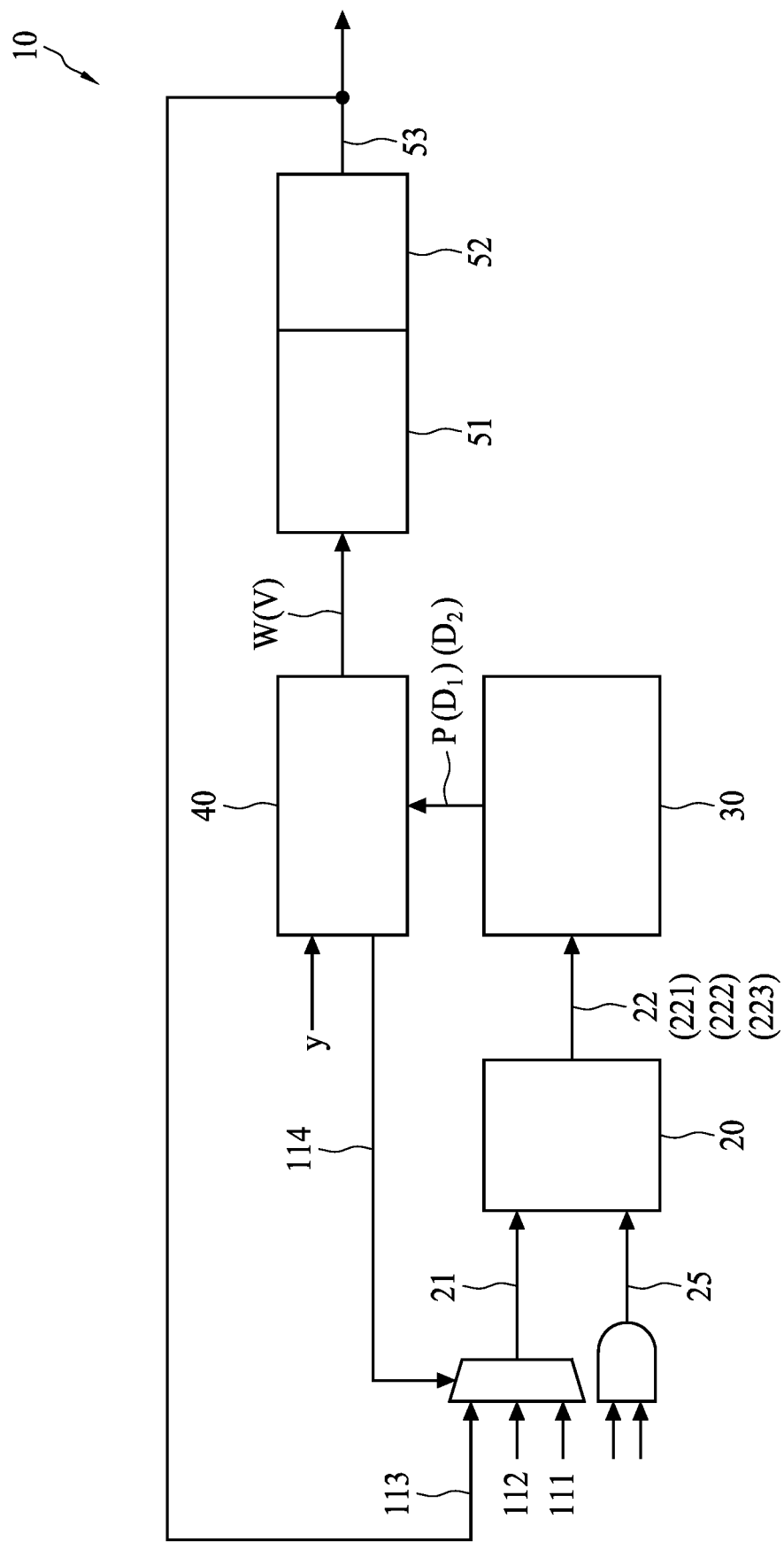
FIG. 1 illustrates a pulse width generator in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 0.5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about," Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to the figures, wherein like numerals indicate like parts throughout the several views. FIG. 1 illustrates a pulse width generator in accordance with some embodiments of the present disclosure. Referring to FIG. 1, a pulse width generator 10 includes a converter 20, a period calculator 30, an auto-calibration unit 40, a pulse selecting unit 51 and an output generation unit 52. The pulse width generator 10 may be configured to generate a tunable pulse width output signal 53. The pulse width output signal 53 may be tunable.

In accordance with some embodiments of the present disclosure, the pulse width calculator 10 further includes a multiplexer 11. The multiplexer 11 is configured to receive a first predetermined clock signal 111, a second predetermined clock signal 112 and a feedback signal 113. The first predetermined clock signal 111 is different from the second predetermined clock signal 112. The first predetermined clock signal 111 has a first predetermined period value T, and the second predetermined clock signal 112 has a second predetermined period value UT, where U>1. The multiplexer 11 is controlled by a control signal 114 from the auto-calibration unit 40. The control signal 114 is used to switch one of the first predetermined clock signal 111, the second predetermined clock signal 112 and the feedback signal 113 connecting to an output of the multiplexer 11. The output of the multiplexer 11 is connected to an input of the converter 20. Therefore, one of the first predetermined clock signal 111, the second predetermined clock signal 112 and the feedback signal 113 may be inputted to the converter 20.

The converter 20 may be configured for converting a clock signal 21 to a digital code 22, the clock signal 21 may be one of the three clock signals, the first predetermined clock signal 111, the second predetermined clock signal 112 or the feedback signal 113 from the multiplexer 11. Therefore, the converter 20 may convert the first predetermined clock signal 111 to a first predetermined digital code 221, and convert the second predetermined clock signal 112 to a second predetermined digital code, and convert the feedback signal 113 to a feedback digital code 223. Therefore, the digital code 22 may be the first predetermined digital code 221, the second predetermined digital code 222, or the feedback digital code 223. For brevity, the following paragraphs only describe the first predetermined digital code 221 and the second predetermined digital code 222.

In accordance with some embodiments of the present disclosure, the period calculator 30 is configured for calculating a period value P according to the digital code 22 from the converter 20. The converter 20 may convert the first predetermined clock signal 111 to the first predetermined digital code 221, and convert the second predetermined clock signal 112 to the second predetermined digital code. The period calculator 30 may receive the first predetermined digital code 221 and the second predetermined digital code 222 from the converter 20. In accordance with some embodiments of the present disclosure, the period calculator 30 may calculate a first calculated period value $D_1$ according to the first predetermined digital code 221, and calculating a second calculated period value $D_2$ according to the second predetermined digital code 222. The period value P calculated by the period calculator 30 may be the first calculated period value $D_1$ or the second calculated period value $D_2$.

In accordance with some embodiments of the present disclosure, the auto-calibration unit 40 may be configured for receiving a predetermined pulse width y, and calculating a first pulse width code V corresponding to the predetermined pulse width y according to the first predetermined period value T, the second predetermined period value UT, the first calculated period value $D_1$, the second calculated period value $D_2$ and the predetermined pulse width y. The first predetermined period value T and the second predetermined period value UT may be inputted to the auto-calibration unit 40, or be transmitted to the auto-calibration unit 40 by the period calculator 30. The first calculated period value $D_1$ and the second calculated period value $D_2$ are calculated by the period calculator 30, then transmitted to the auto-calibration unit 40.

In accordance with some embodiments of the present disclosure, the pulse selecting unit 51 and the output generation unit 52 are configured for generating the pulse width output signal 53 according to the first pulse width code V. Since the first pulse width code V is calculated according to the first predetermined period value T, the second predetermined period value UT, the first calculated period value $D_1$, the second calculated period value $D_2$ and the predetermined pulse width y, the first pulse width code V may be relative to the factors of the first predetermined period value T, the second predetermined period value UT, the first calculated period value $D_1$, the second calculated period value $D_2$ and the predetermined pulse width y. Therefore, the first pulse width code V may be adjusted by the above factors, and the pulse width output signal 53 may be adjusted by the first pulse width code V.

Figure 2:
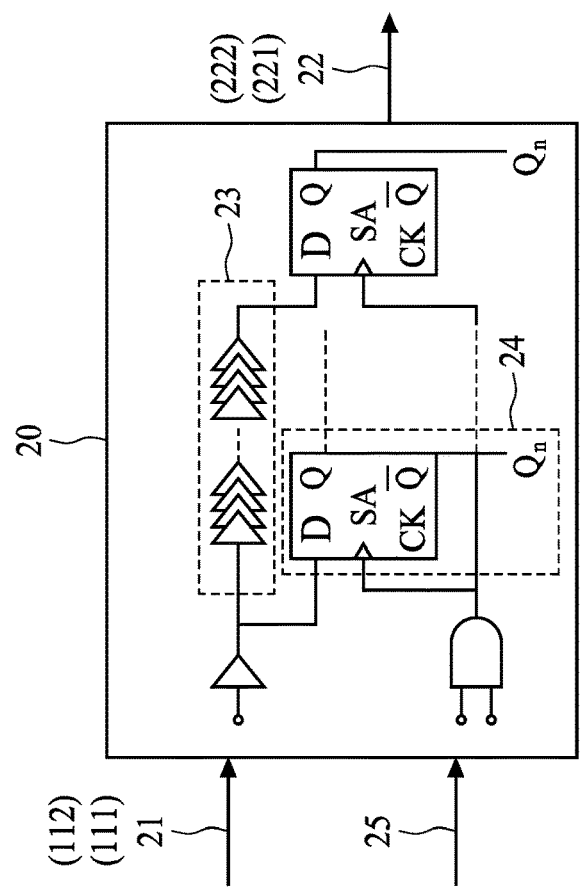
FIG. 2 illustrates a converter in accordance with some embodiments of the present disclosure.

In accordance with some embodiments of the present disclosure, the feedback signal 113 is connected to the pulse width output signal 53 and inputted to the converter 20 by the multiplexer 11. The feedback signal 113 may be used to further adjust the first pulse width code V and the pulse width output signal 53, FIG. 2 illustrates a converter in accordance with some embodiments of the present disclosure. Referring to FIG. 1 and FIG. 2, in accordance with some embodiments of the present disclosure, the converter 20 may be a delayline-based time-to-digital converter (TDC). The converter 20 is configured for converting the clock signal 21 to the digital code 22. In accordance with some embodiments of the present disclosure, the clock signal 21 may be the first predetermined clock signal 111 or the second predetermined clock signal 112 from the multiplexer 11 as shown in FIG. 1. Thus, the converter 20 may convert the first predetermined clock signal 111 to the first predetermined digital code 221, and convert the second predetermined clock signal 112 to the second predetermined digital code 222. Therefore, the digital code 22 may be the first predetermined digital code 221 or the second predetermined digital code 222 after the converter 20 converts the first predetermined clock signal 111 or the second predetermined clock signal 112.

Figure 3:
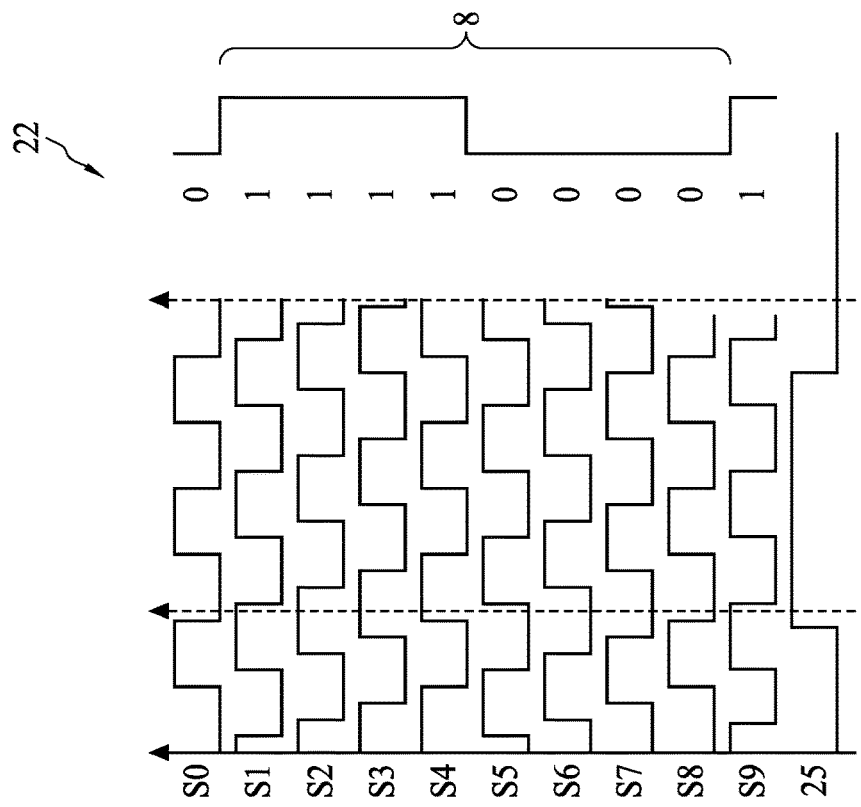
FIG. 3 is a waveform diagram of exemplary sampling signals and digital code in accordance with some embodiments of the present disclosure.

FIG. 3 is a waveform diagram of exemplary sampling signals and digital code in accordance with some embodiments of the present disclosure. Referring to FIG. 2 and FIG. 3, in accordance with some embodiments of the present disclosure, the converter 20 includes a delay line 23 and a plurality of sampling units 24. The delay line 23 is configured for generating a delay time, and the sampling units 24 are configured for generating a plurality of sampling signals S0-S9 with the delay time. For example, comparing the sampling signal S0 and the sampling signal S1, the sampling signal S1 is delayed by a delay time than the sampling signal S0. The other sampling signals are similar to the sampling signal S0 and the sampling signal S1. In accordance with some embodiments of the present disclosure, the digital code 22 is generated according to the sampling signals S0-S9 and a sampling clock signal 25. When the sampling clock signal 25 is at a high level to sample, the level of the sampling signals S0-S9 are obtained to be the digital code 22. The digital code includes a plurality of bits, for example, . . . 0111100001. Thus, the period value of the digital code 22 is 8.

In accordance with some embodiments of the present disclosure, the delay line 23 is configured for generating the delay time. However, the delay time of the delay line 23 is various due to pressure, voltage and temperature factors, which may result in errors of the digital code 22.

Figure 4:
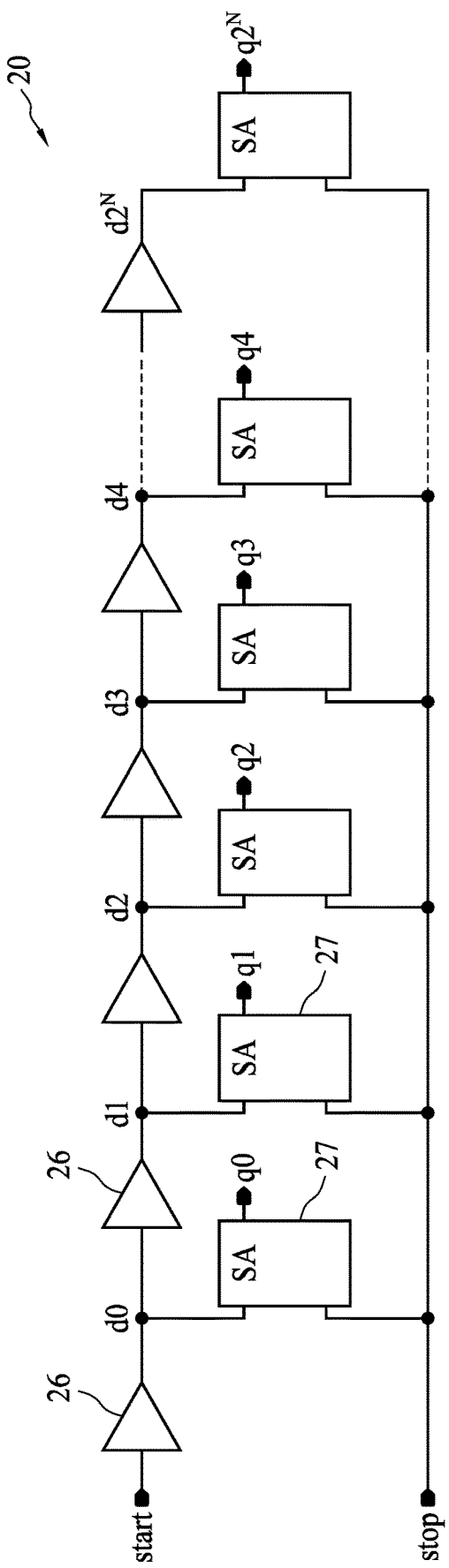
FIG. 4 illustrates a converter in accordance with some embodiments of the present disclosure.

FIG. 4 illustrates a converter in accordance with some embodiments of the present disclosure. Referring to FIG. 4, in accordance with some embodiments of the present disclosure, the converter 20 may be a delayline-based time-to-digital converter (TDC). The converter 20 includes a plurality of delay units 26 and a plurality of sense amplifiers 27. The delay units 26 are configured for generating a plurality of delay time, and the sense amplifiers 27 are configured for generating a plurality of sampling signals with the delay times. Similarly, the converter 20 in FIG. 4 may also generate the digital code 22 as shown in FIG. 3.

Figure 5:
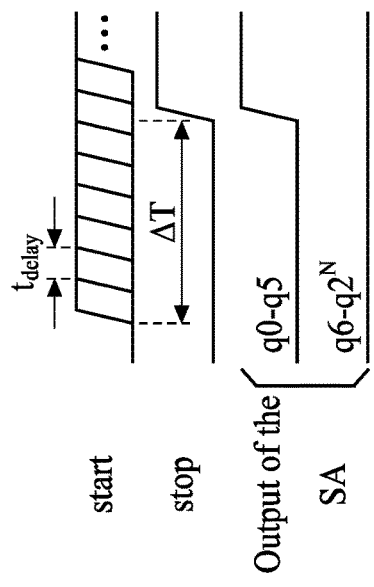
FIG. 5 is a waveform diagram of exemplary sampling signals of the sense amplifiers in accordance with some embodiments of the present disclosure.

FIG. 5 is a waveform diagram of exemplary sampling signals of the sense amplifiers in accordance with some embodiments of the present disclosure. Referring to FIG. 4 and FIG. 5, in accordance with some embodiments of the present disclosure, the sense amplifiers 24 may be used to distinguish the difference when the time difference between the start signal and the stop signal is small.

Figure 6:
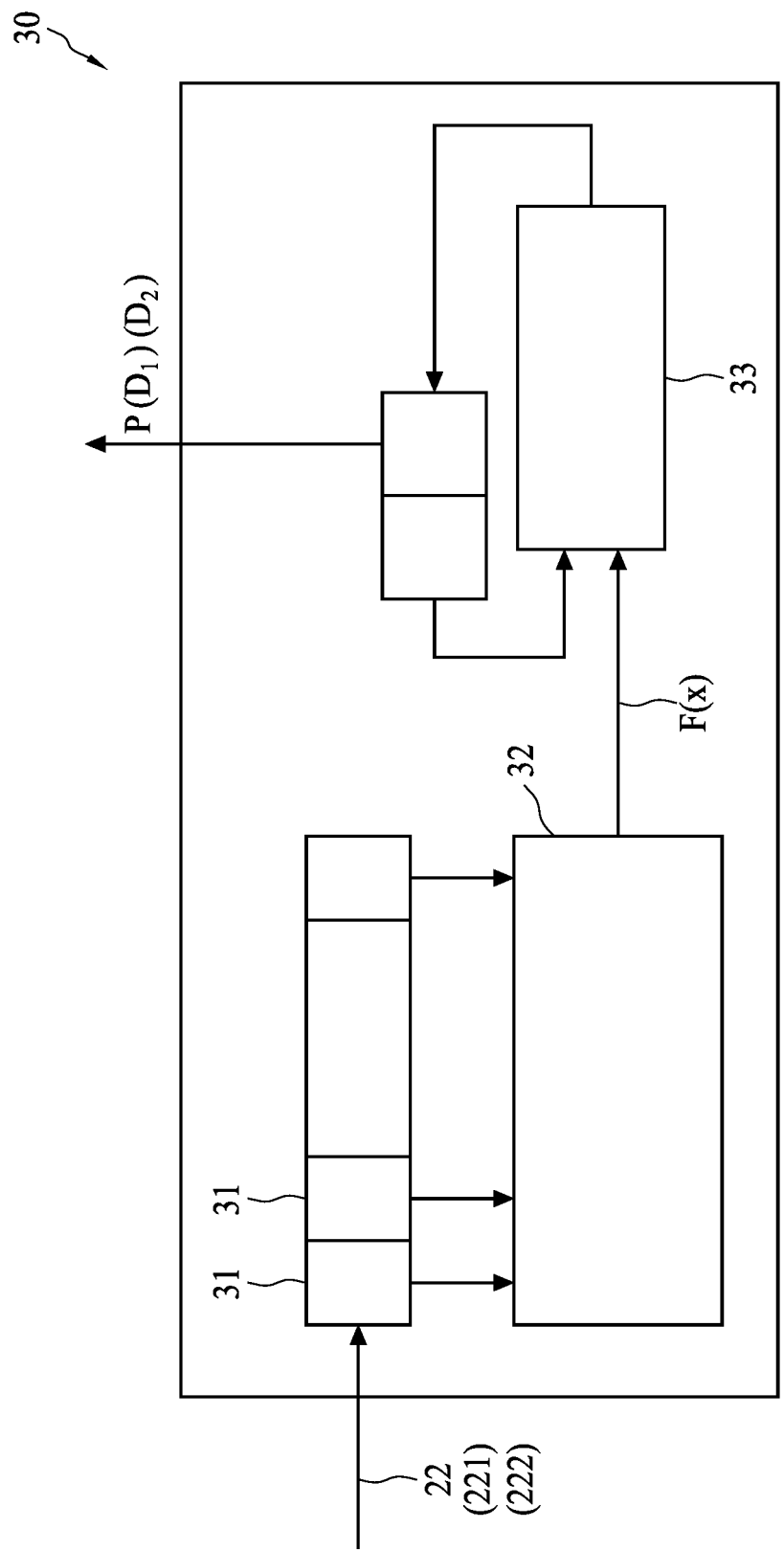
FIG. 6 illustrates a period calculator in accordance with some embodiments of the present disclosure.

FIG. 6 illustrates a period calculator in accordance with some embodiments of the present disclosure. Referring to FIG. 6, in accordance with some embodiments of the present disclosure, the period calculator 30 is configured for calculating the period value according to the digital code 22 from the converter 20. In accordance with some embodiments of the present disclosure, since the converter 20 may convert the first predetermined clock signal 111 to the first predetermined digital code 221, and convert the second predetermined clock signal 112 to the second predetermined digital code 222, the period calculator 30 may receive the first predetermined digital code 221 and the second predetermined digital code 222 from the converter 20. In accordance with some embodiments of the present disclosure, the period calculator 30 may calculate the first calculated period value $D_1$ according to the first predetermined digital code 221, and calculating the second calculated period value $D_2$ according to the second predetermined digital code 222. The period value P calculated by the period calculator 30 may be the first calculated period value $D_1$ or the second calculated period value $D_2$.

In accordance with some embodiments of the present disclosure, the period calculator 30 may include a plurality of input registers 31, a gradient descent calculator 32, and a comparator 33. The input registers 31 are configured for storing the digital code 22 and outputting to the gradient descent calculator 32.

Figure 7:
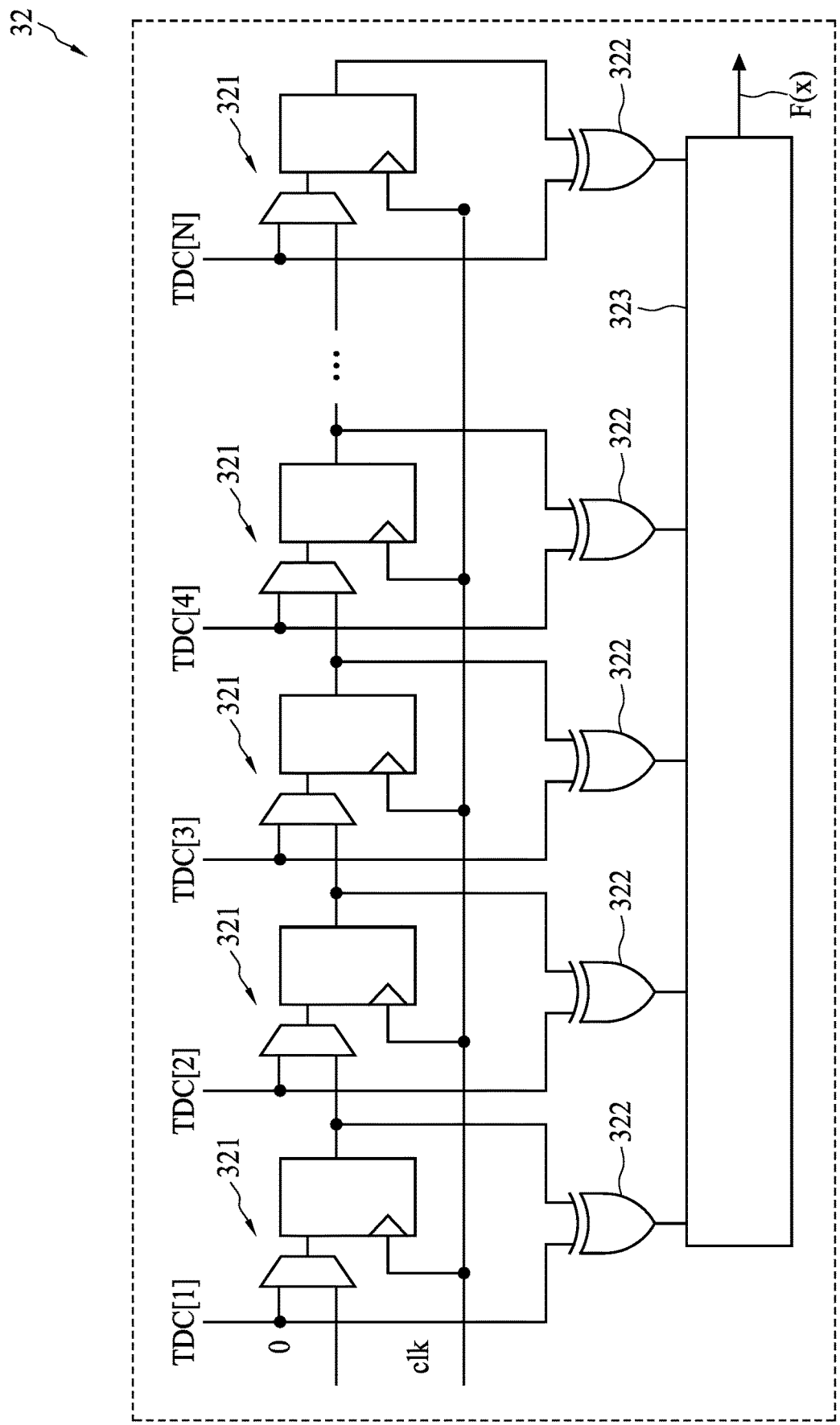
FIG. 7 illustrates a gradient descent calculator in accordance with some embodiments of the present disclosure.

FIG. 7 illustrates a gradient descent calculator in accordance with some embodiments of the present disclosure. Referring to FIG. 6 and FIG. 7, the gradient descent calculator 32 is configured for receiving the digital code 22, and shifting the digital code to be a shifted digital code for a plurality of times, and comparing the shifted digital code and a previous shifted digital code before shifting to obtain a plurality of difference values for representing the number of the difference between the shifted digital code and the previous shifted digital code. In accordance with some embodiments of the present disclosure, the gradient descent calculator 32 includes a plurality of shift registers 321, a plurality of comparing elements 322, and a sum calculator 323. The shift registers 321 is configured for shifting the digital code for a plurality of times. In accordance with some embodiments of the present disclosure, the digital code is shifted a bit to a right hand side, and a zero bit is filled to the digital code at the first bit of a left hand side. For example, the digital code includes a plurality of bits, and the bits are 11110000. After shifting one time, the bits of the shifted digital code are 01111000.

The comparing elements 322 are configured for comparing the shifted digital code and the previous shifted digital code. For example, the comparing element 322 is an XOR element. The shifted digital code has a plurality of bits, and the previous shifted digital code having a plurality of bits. According to the above example, the bits of the shifted digital code are 01111000, and the bits of the previous shifted digital code are 11110000. After comparing the bits of the shifted digital code and those of the previous shifted digital code, the value one is outputted for representing the difference between bits of the shifted digital code and those of the previous shifted digital code, and the value zero is outputted for representing the same bits of the shifted digital code and the previous shifted digital code. According to the above example, since the first bit of the shifted digital code is 0, and the first bit of the previous shifted digital code is 1, the first comparing element 322 outputs the value one. Furthermore, the fifth bit of the shifted digital code is 1, and the fifth bit of the previous shifted digital code is 0, the fifth comparing element 322 outputs the value one. The other comparing elements 322 output the value zero. The sum calculator 323 is configured for adding the outputs from the comparing elements 322 to obtain the difference values. According to the above example, for the first shifting, the difference value is two (one plus one). For the plurality shiftings, the difference values may be F(x).

Figure 8:
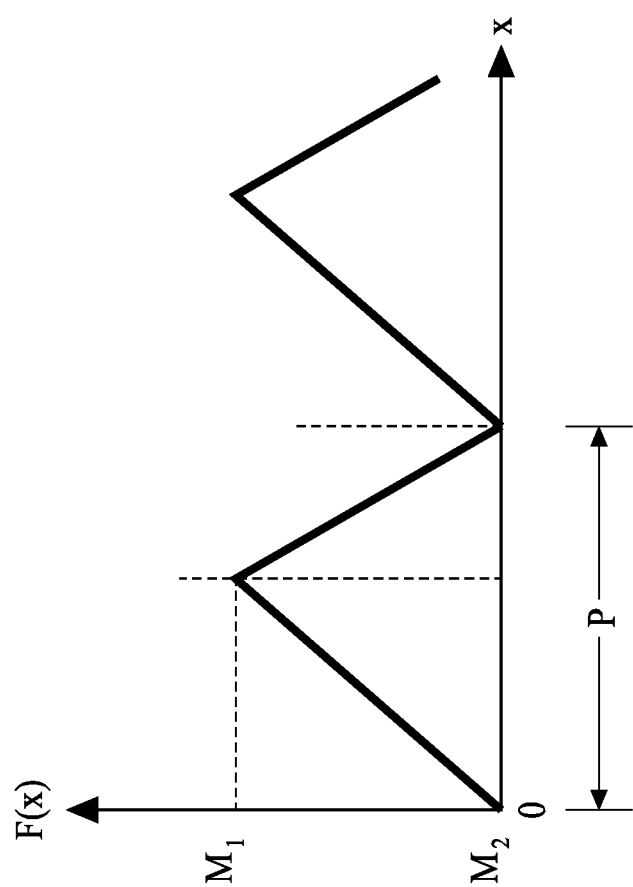
FIG. 8 is a diagram illustrating a first simulation result of the difference values.

FIG. 8 is a diagram illustrating a first simulation result of the difference values. Referring to FIG. 6, and FIG. 8, the comparator 33 is configured for receiving the difference values and obtaining a first high value $M_1$ and a first low value $M_2$ from the difference values, and outputting the period value P according to the first high value $M_1$ and the first low value $M_2$. In accordance with some embodiments of the present disclosure, if the first low value $M_2$ is found, the period value P may be obtained. Therefore, the period value P may be obtained according to the first low value $M_2$.

In accordance with some embodiments of the present disclosure, the difference values F(x) are expressed as:

$$F(x) = \sum_{j=0}^{N} C[j] \wedge C[j+x]$$

where N is the length of the digital code, x is the number of clock shift (N≥x≥0), and C[j] is the digital code.

In accordance with some embodiments of the present disclosure, the period calculator 30 further includes a correlation factor R, the correlation factor R≤N. The correlation factor R may be used for reducing the element in the sum calculator 323 so as to reduce the cost of the sum calculator 323.

Figure 9:
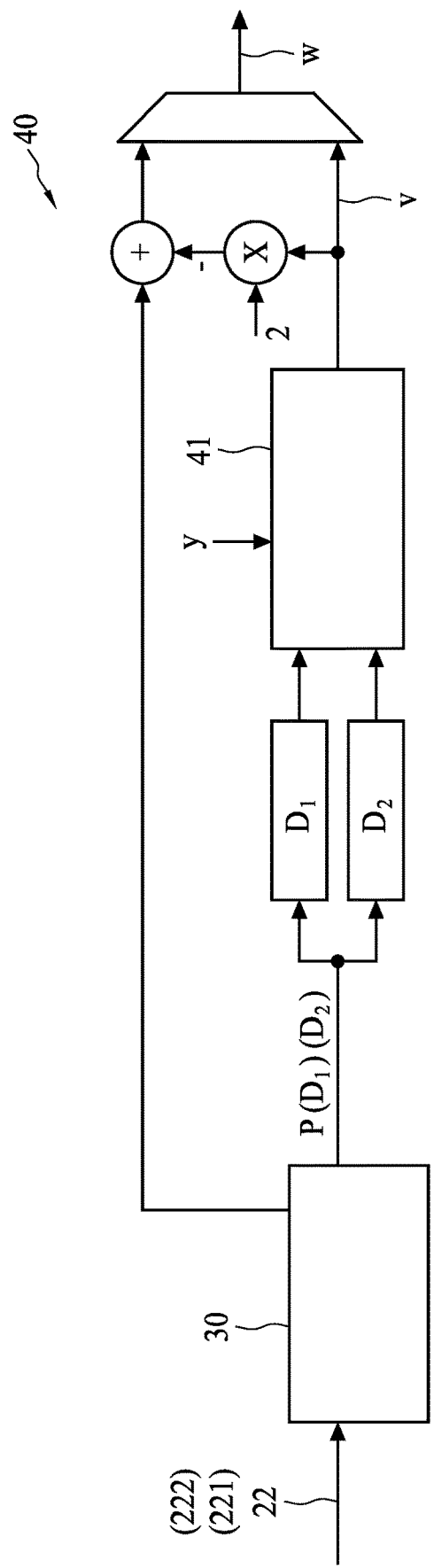
FIG. 9 illustrates an auto-calibration unit in accordance with some embodiments of the present disclosure.

FIG. 9 illustrates an auto-calibration unit in accordance with some embodiments of the present disclosure. Referring to FIG. 9, the auto-calibration unit 40 includes a pulse width calculator 41. The pulse width calculator 41 is configured for receiving the first predetermined period value, the second predetermined period value, the first calculated period value, the second calculated period value and a predetermined pulse width y, and calculating a first pulse width code V corresponding to the predetermined pulse width y. The first pulse width code V may be calculated according to the first predetermined period value T, the second predetermined period value UT, the first calculated period value $D_1$, the second calculated period value $D_2$ and the predetermined pulse width y. The first predetermined period value T and the second predetermined period value UT may be inputted to the pulse width calculator 41, or be transmitted to the pulse width calculator 41 by the period calculator 30. The first calculated period value $D_1$ and the second calculated period value $D_1$ are calculated by the period calculator 30, then transmitted to the pulse width calculator 41. Therefore, the first pulse width code V may be calculated according to the first predetermined period value T, the second predetermined period value UT, the first calculated period value $D_1$, the second calculated period value $D_2$ and the predetermined pulse width y by pulse width calculator 41.

Figure 10:
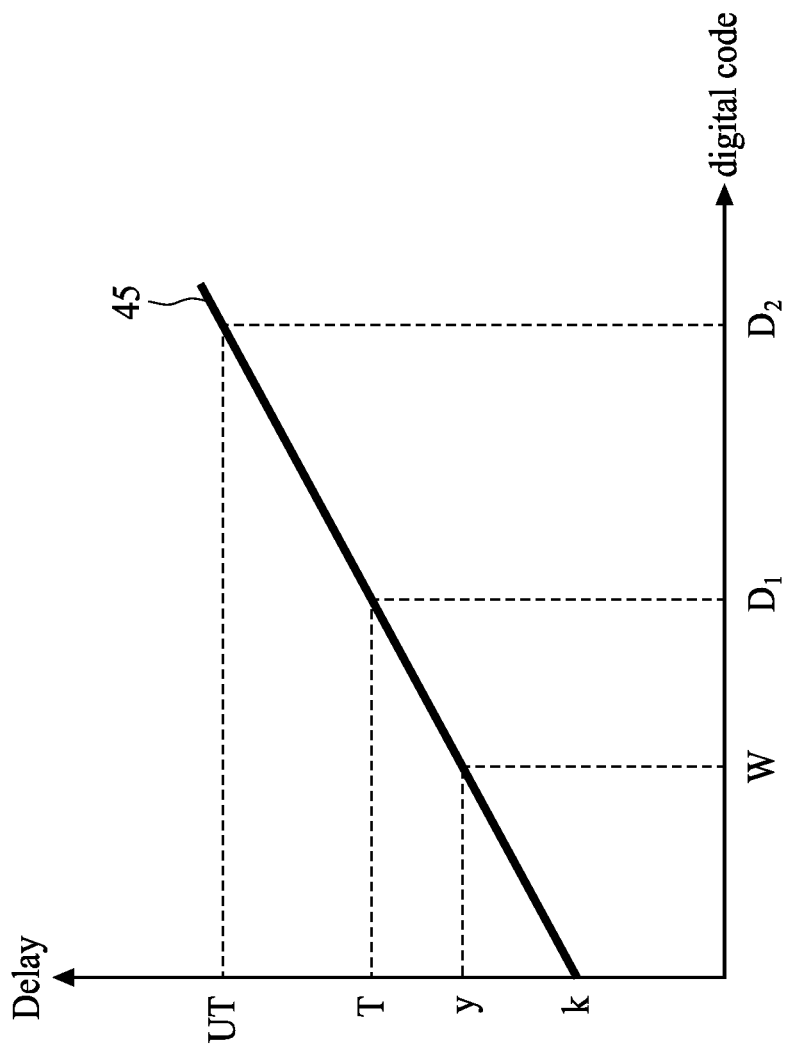
FIG. 10 is a diagram illustrating simulation results of a transfer curve in accordance with some embodiments of the present disclosure.

FIG. 10 is a diagram illustrating simulation results of a transfer curve in accordance with some embodiments of the present disclosure. Referring to FIG. 9 and FIG. 10, the pulse width calculator 41 is configured for calculating an offset value k, the offset value k is expressed as:

$$k = \frac{TD_2 - UTD_1}{D_2 - D_1}$$

where T is the first predetermined period value, UT is the second predetermined period value, and U>1, $D_1$ is the first calculated period value, and $D_2$ is the second calculated period value. For example, the first predetermined period value T is 200, and the second predetermined period value UT is 250, where U is 1.25. After calculating, the first calculated period value $D_1$ is 25, and the second calculated period value $D_2$ is 31. Then, the offset value k is $$-8.33 \left( \frac{200 \times 31 - 250 \times 25}{31 - 25} \right).$$

In accordance with some embodiments of the present disclosure, the delay time of the delay line 23 is calculated by the converter 20 as shown in FIG. 2. However, the delay time of the delay line 23 is various due to pressure, voltage and temperature factors, which may not synchronize with PLL (Phase Loop Lock) to generate an absolute wanted value. Moreover, the first calculated period value $D_1$ calculated by the converter 20 and the period calculator 30 according to the first predetermined clock signal may not be equal to the first predetermined period value T of the first predetermined clock signal, and the second calculated period value $D_2$ calculated by the converter 20 and the period calculator 30 according to the second predetermined clock signal may not be equal to the second predetermined period value UT of the second predetermined clock signal.

In accordance with some embodiments of the present disclosure, the pulse width calculator 41 is configured for calculating a linear extrapolation equation of a transfer curve 45, the linear extrapolation equation is expressed as:

$$y = \frac{T(U-1)}{D_2 - D_1} V + k = \frac{T(U-1)}{D_2 - D_1} V + \frac{T(D_2 - UD_1)}{D_2 - D_1}$$

where y is the predetermined pulse width, and is user wanted pulse width, V is the first pulse width code.

Based on the linear extrapolation equation of the transfer curve 45, the first pulse width code V is expressed as:

$$V = \frac{y}{T} \times \frac{D_2 - D_1}{U - 1} - \frac{D_2 - UD_1}{U - 1}$$

Where the value y/T is the ratio of the predetermined pulse width y to the first predetermined period value T. Therefore, the linear extrapolation equation of the transfer curve 45 may be used to compensate the various delay time due to pressure, voltage and temperature factors so as to obtain an exact pulse width generation. Further, the linear extrapolation equation of a transfer curve 45 may be performed each time to calculate the first pulse width code V instead of one shoot only for each condition in the prior art. For example, the predetermined pulse width y is 50. According to the above example, the first pulse width code V is $$7\left( \frac{50}{200} \times \frac{31 - 25}{1.25 - 1} - \frac{31 - 1.25 \times 25}{1.25 - 1} \right).$$

In accordance with some embodiments of the present disclosure, the auto-calibration unit 40 further includes a first operator for comparing the first pulse width code and a check value. The check value E is the number of 1 of bits of the feedback signal 113. The auto-calibration unit 40 further includes a second operator for calculating a modified value M, wherein the modified value is equal to the first pulse width code V minus the check value E, M=V−E.

In accordance with some embodiments of the present disclosure, the pulse width calculator 41 is configured for calculating a second pulse width code W, the second pulse width code W is expressed as:

$$W = \frac{y}{(U-1)T} \times (D_2 - D_1) - \frac{D_2 - UD_1}{U - 1} + M$$

where M is the modified value. For example, the modified value M is 1. According to the above example, the second pulse width code W is 8 (7+1).

Referring to FIG. 9 and FIG. 1, in accordance with some embodiments of the present disclosure, the pulse selecting unit 51 and the output generation unit 52 are configured for generating the pulse width output signal 53 according to the first pulse width code V or the second pulse width code W. The feedback signal 113 is connected to the pulse width output signal 53 and inputted to the converter 20 by the multiplexer 11.

Figure 11:
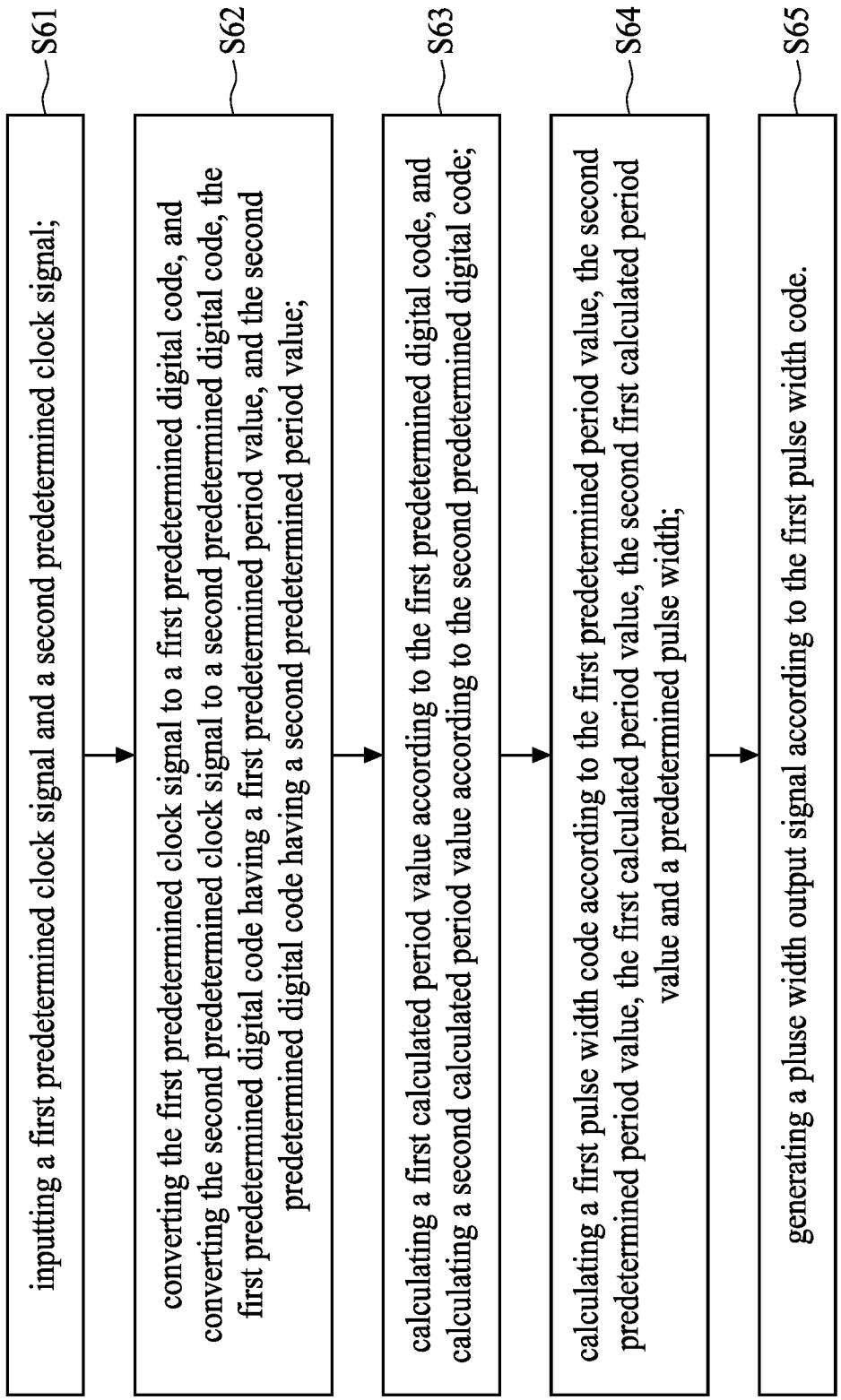
FIG. 11 is a flow diagram showing a method of generating a pulse width output signal in accordance with some embodiments of the present disclosure.

FIG. 11 is a flow diagram showing a method of generating a pulse width output signal in accordance with some embodiments of the present disclosure. Referring to FIG. 1 and FIG. 12, in step S61, the first predetermined clock signal 111 and the second predetermined clock signal 112 is inputted to the converter 20. The first predetermined clock signal 111 and the second predetermined clock signal 112 may be inputted to the multiplexer 11, then by the control signal 114, the first predetermined clock signal 111 and the second predetermined clock signal 112 are inputted to the converter 20.

In step S62, using the converter 20 the first predetermined clock signal 111 is converted to the first predetermined digital code 221, and the second predetermined clock signal 112 is converting to the second predetermined digital code 222. The first predetermined digital code has the first predetermined period value T, and the second predetermined digital code has the second predetermined period value UT.

In step S63, using the period calculator 30 the first calculated period value is calculated according to the first predetermined digital code 221 and a second calculated period value is calculated according to the second predetermined digital code 222.

In step S64, using the auto-calibration unit 40 the first pulse width code V is calculated according to the first predetermined period value, the second predetermined period value, the first calculated period value, the second calculated period value and a predetermined pulse width y.

In step S65, using the pulse selecting unit 51 and an output generation unit 52 the pulse width output signal 53 is generated according to the first pulse width code.

In some embodiments, a circuit is disclosed, including: a gradient descent calculator and a comparator. The gradient descent calculator is configured for receiving a digital code, and shifting the digital code to be a shifted digital code for a plurality of times, and comparing the shifted digital code and a digital code to obtain a plurality of difference values for representing the number of the difference between the shifted digital code and the previous shifted digital code. The comparator is configured for receiving the difference values and obtaining a first low value from the difference values, and outputting a period value according to the first low value.

In some embodiments, a circuit is disclosed, including: a period calculator and a pulse width calculator. The period calculator is configured for receiving a first predetermined digital code and a second predetermined digital code, and for calculating a first calculated period value according to the first predetermined digital code, and calculating a second calculated period value according to the second predetermined digital code. The first predetermined digital code has a first predetermined period value, and the second predetermined digital code has a second predetermined period value. The pulse width calculator is configured for receiving a predetermined pulse width, and calculating a first pulse width code corresponding to the predetermined pulse width according to the first predetermined period value, the second predetermined period value, the first calculated period value, the second calculated period value and the predetermined pulse width.

In some embodiments, a method is disclosed, including: inputting a first predetermined clock signal and a second predetermined clock signal in sequence; converting the first predetermined clock signal to a first predetermined digital code, and converting the second predetermined clock signal to a second predetermined digital code, the first predetermined digital code having a first predetermined period value, and the second predetermined digital code having a second predetermined period value; calculating a first calculated period value according to the first predetermined digital code, and calculating a second calculated period value according to the second predetermined digital code; calculating a first pulse width code according to the first predetermined period value, the second predetermined period value, the first calculated period value, the second calculated period value and an predetermined pulse width and generating a pulse width output signal according to the first pulse width code.

What is claimed is:

1. A circuit, comprising:
   a period calculator, for receiving a first predetermined digital code and a second predetermined digital code, and for calculating a first calculated period value according to the first predetermined digital code, and calculating a second calculated period value according to the second predetermined digital code, the first predetermined digital code having a first predetermined period value, the second predetermined digital code having a second predetermined period value; and
   a pulse width calculator, for receiving a predetermined pulse width, and calculating a first pulse width code corresponding to the predetermined pulse width according to the first predetermined period value, the second predetermined period value, the first calculated period value, the second calculated period value and the predetermined pulse width.

2. The circuit of claim 1, the pulse width calculator is configured for calculating an offset value k, the offset value k is expressed as:

$$k = \frac{TD_2 - UTD_1}{D_2 - D_1}$$

where T is the first predetermined period value, UT is the second predetermined period value, and U>1, $D_1$ is the first calculated period value, and $D_2$ is the second calculated period value.

3. The circuit of claim 2, wherein the pulse width calculator is configured for calculating a linear extrapolation equation of a transfer curve, the linear extrapolation equation is expressed as:

$$y = \frac{T(U-1)}{D_2 - D_1}V + k = \frac{T(U-1)}{D_2 - D_1}V + \frac{T(D_2 - UD_1)}{D_2 - D_1}$$

where y is the predetermined pulse width, V is the first pulse width code.

4. The circuit of claim 3, wherein the first pulse width code V is expressed as:

$$V = \frac{y}{T} \times \frac{D_2 - D_1}{U - 1} - \frac{D_2 - UD_1}{U - 1}.$$

5. The circuit of claim 4, further comprising a first operator for comparing the first pulse width code and a check value.

6. The circuit of claim 5, further comprising a second operator for calculating a modified value, wherein the modified value is equal to the first pulse width code minus the check value.

7. The circuit of claim 6, wherein the pulse width calculator is configured for calculating a second pulse width code W, the second pulse width code W is expressed as:

$$W = \frac{y}{(U-1)T} \times (D_2 - D_1) - \frac{D_2 - UD_1}{U - 1} + M$$

where M is the modified value.

8. The circuit of claim 1, further comprising a converter for converting a first predetermined clock signal to the first predetermined digital code, and converting a second predetermined clock signal to the second predetermined digital code.

9. The circuit of claim 8, wherein the converter comprises a delay line and a plurality of sampling units, the delay line is configured for generating a delay time, and the sampling units are configured for generating a plurality of sampling signals with the delay time.

10. The circuit of claim 8, wherein the converter comprises a plurality of delay units and a plurality of sense amplifiers, the delay units are configured for generating a plurality of delay time, and the sense amplifiers are configured for generating a plurality of sampling signals with the delay times.

11. The circuit of claim 8, further comprising a pulse selecting unit and an output generation unit, the pulse selecting unit is configured for receiving the first pulse width code, and the output generation unit is configured for generating a pulse width output signal.

12. The circuit of claim 11, further comprising a feedback signal connecting to the pulse width output signal and inputting to the converter.

13. The circuit of claim 12, wherein the converter is configured to convert the feedback signal to a feedback digital code.

14. A circuit, comprising:
a gradient descent calculator, for receiving a digital code, and shifting the digital code to be a shifted digital code for a plurality of times, and comparing the shifted digital code and a previous shifted digital code before shifting to obtain a plurality of difference values for representing the number of the difference between the shifted digital code and the previous shifted digital code; and
a comparator, for receiving the difference values and obtaining a first low value from the difference values, and outputting a period value according to the first low value.

15. The circuit of claim 14, further comprising a plurality of input registers for storing the digital code and outputting to the gradient descent calculator.

16. The circuit of claim 14, wherein the gradient descent calculator comprises:
a plurality of shift registers, for shifting the digital code;
a plurality of comparing elements, for comparing the shifted digital code and the previous shifted digital code, the shifted digital code having a plurality of bits, and the previous shifted digital code having a plurality of bits, after comparing the bits of the shifted digital code and those of the previous shifted digital code, outputting one representing the difference between bits of the shifted digital code and those of the previous shifted digital code, and outputting zero representing the same bits of the shifted digital code and the previous shifted digital code; and
a sum calculator, for adding the outputs from the comparing elements to obtain the difference values.

17. The circuit of claim 14, wherein the comparator is configured for obtaining a first high value.

18. The circuit of claim 14, wherein the difference values F(x) are expressed as:

$$F(x) = \sum_{j=0}^{N} C[j]^{\wedge} C[j+x]$$

where N is the length of the digital code, x is the number of clock shift (N≥x≥0), and C[j] is the digital code.

19. The circuit of claim 18, further comprising a correlation factor R, wherein the correlation factor R≤N.

20. A method, comprising:
inputting a first predetermined clock signal and a second predetermined clock signal;
converting the first predetermined clock signal to a first predetermined digital code, and converting the second predetermined clock signal to a second predetermined digital code, the first predetermined digital code having a first predetermined period value, and the second predetermined digital code having a second predetermined period value;
calculating a first calculated period value according to the first predetermined digital code, and calculating a second calculated period value according to the second predetermined digital code;
calculating a first pulse width code according to the first predetermined period value, the second predetermined period value, the first calculated period value, the second calculated period value and an predetermined pulse width; and
generating a pulse width output signal according to the first pulse width code.

* * * * *